United States Patent
Baseman et al.

(10) Patent No.: US 8,533,635 B2
(45) Date of Patent: Sep. 10, 2013

(54) RULE-BASED ROOT CAUSE AND ALIAS ANALYSIS FOR SEMICONDUCTOR MANUFACTURING

(75) Inventors: Robert J. Baseman, Yorktown Heights, NY (US); Fateh A. Tipu, Yorktown Heights, NY (US); Sholom M. Weiss, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 803 days.

(21) Appl. No.: 12/690,492

(22) Filed: Jan. 20, 2010

(65) Prior Publication Data

US 2011/0178624 A1    Jul. 21, 2011

(51) Int. Cl.
*G06F 17/50*    (2006.01)

(52) U.S. Cl.
USPC ............................................................ 716/51

(58) Field of Classification Search
USPC ............................................................ 716/51
See application file for complete search history.

(56) References Cited

U.S. PATENT DOCUMENTS

| | | | | |
|---|---|---|---|---|
| 6,907,369 | B1 * | 6/2005 | Markle et al. | 702/81 |
| 7,127,304 | B1 * | 10/2006 | Gould et al. | 700/20 |
| 7,539,585 | B2 | 5/2009 | Baseman et al. | |
| 2008/0312858 | A1 * | 12/2008 | Baseman et al. | 702/83 |

OTHER PUBLICATIONS

"T Test", National Institute of Standards and Technology (NIST), DATAPLOT Reference Manual, Mar. 12, 1997, http://www.itl.nist.gov/div898/software/dataplot/refman1/ch3/t_test.pdf.

* cited by examiner

*Primary Examiner* — Suresh Memula
(74) *Attorney, Agent, or Firm* — Scully, Scott, Murphy & Presser, P.C.; Daniel P. Morris, Esq.

(57) ABSTRACT

The present invention includes a computing system determining a best alias rule in a semiconductor manufacturing process. The computing system obtains an original rule and candidate alias rules based on sampled data from the semiconductor manufacturing process. The computing system compares the original rule to the candidate alias rules. The computing system ranks the candidate alias rules according to the comparison. The computing system filters the ranked candidate alias rules. A user selects one rule among the filtered candidate alias rules based on knowledge of the semiconductor manufacturing process.

19 Claims, 6 Drawing Sheets

| ToolStep | TargetMean | WaferCount | USED-Alias | FULL-Alias |
|---|---|---|---|---|
| TS_A | 214.9958273 | 52 | 1 | 1 |
| TS_B | 199.7448052 | 369 | 1 | 0.140921409 |
| TS_C | 199.7448052 | 369 | 1 | 0.140921409 |
| TS_D | 199.7448052 | 369 | 1 | 0.140921409 |
| TS_E | 202.90439 | 129 | 0.903846154 | 0.764227642 |
| TS_F | 199.3609655 | 345 | 0.884615385 | 0.173441734 |
| TS_G | 202.7705638 | 201 | 0.807692308 | 0.54200542 |
| TS_H | 199.0511057 | 256 | 0.807692308 | 0.39295393 |
| TS_I | 202.9734465 | 150 | 0.788461538 | 0.680216802 |
| TS_J | 200.8018216 | 247 | 0.788461538 | 0.411924119 |
| TS_K | 200.2184296 | 293 | 0.769230769 | 0.281842818 |
| TS_L | 207.4030272 | 143 | 0.711538462 | 0.672086721 |
| TS_M | 197.5392916 | 179 | 0.711538462 | 0.574525745 |
| TS_N | 200.1794002 | 267 | 0.711538462 | 0.33604336 |
| TS_O | 200.837078 | 258 | 0.711538462 | 0.360433604 |
| TS_P | 198.5553591 | 311 | 0.711538462 | 0.216802168 |
| TS_Q | 203.2890818 | 171 | 0.692307692 | 0.596205962 |
| TS_R | 199.648461 | 195 | 0.692307692 | 0.525745257 |
| TS_S | 198.1428063 | 227 | 0.673076923 | 0.43902439 |
| TS_T | 198.2911053 | 208 | 0.673076923 | 0.490514905 |
| TS_U | 200.0483396 | 221 | 0.673076923 | 0.449864499 |
| TS_V | 203.2907075 | 183 | 0.634615385 | 0.552845528 |
| TS_W | 203.3972217 | 114 | 0.615384615 | 0.72899729 |
| TS_X | 201.8604691 | 277 | 0.615384615 | 0.281842818 |
| TS_Y | 204.4291673 | 112 | 0.615384615 | 0.72899729 |
| TS_Z | 199.6971319 | 242 | 0.615384615 | 0.376693767 |

FIG. 4

RULE-BASED ROOT CAUSE AND ALIAS ANALYSIS FOR SEMICONDUCTOR MANUFACTURING

BACKGROUND

The present invention generally relates to semiconductor manufacturing processes and particularly a system and method for determining, ranking and filtering alias rules for selecting a best alias rule.

An alias rule in a semiconductor manufacturing process refers to a tool step (i.e., a manufacturing step performed in a semiconductor manufacturing tool or a specific component of the tool such as a chamber) that is related to another tool step included in an original rule. For example, assume that to fabricate a wafer, the wafer should go through photolithography 50 times. Then, an alias rule may be a tool step performing the photolithography on the wafer at the first time. A "related" alias rule may be another tool step performing the photolithography on the wafer at the second time. The original rule refers to a potential faulty tool step found by implementing an empirical learning method. The empirical learning method includes, but is not limited to: collecting a large amount of data (e.g., 1 million samples) and then predicting a future outcome (i.e., success/failure of a process or tool or pass/failure of a wafer) based on an analysis on the data.

A semiconductor manufacturing process includes, but not limited to: slicing crystal to obtain wafers, polishing the wafers, growing oxide (e.g., $SiO_2$) on the wafers, performing photolithography on the wafers, removing the oxide on the wafers, diffusing and implanting ions on the wafers, annealing wafers, etc. The photolithography refers to a technique used to define micro-architectures on the wafers.

To find root causes for poor results (e.g., poor wafer yield rates) in the semiconductor manufacturing process, a traditional approach detects potential faulty tools and manufacturing steps by the empirical methods. However, tools that are initially found to be faulty in the traditional approach may be working properly and/or hide an underlying problem (i.e., the root cause of the poor results).

Therefore, it is highly desirable to detect the root causes by evaluating related causes that are alias rules (i.e., related tool steps) to the original rule (i.e., potentially faulty tool steps that are found by the traditional empirical method).

SUMMARY

The present invention describes a system, method and computer program product for determining a best alias rule in a semiconductor manufacturing process to detect the root causes of the poor results in the semiconductor manufacturing process.

In one embodiment, there is provided a computer-implemented method for determining a best alias rule in a semiconductor manufacturing process, the method comprising:
obtaining an original rule and candidate alias rules;
comparing the original rule to the candidate alias rules;
ranking the candidate alias rules according to the comparison;
filtering the ranked candidate alias rules; and
selecting one rule among the filtered candidate alias rules based on a user's knowledge of the semiconductor manufacturing process.

In a further embodiment, the knowledge comprises one or more of: a precision, recall, accuracy or variance of the candidate alias rules, a similarity between each candidate alias rule and to the original rule, similar target measures between each candidate alias rule and the original rule.

In one embodiment, there is provided a computer-implemented system for determining a best alias rule in a semiconductor manufacturing process, the system comprising:
a memory device; and
a processor unit in communication with the memory device, the processor unit performs steps of:
obtaining an original rule and candidate alias rules;
comparing the original rule to the candidate alias rules;
ranking the candidate alias rules according to the comparison;
filtering the ranked candidate alias rules; and
selecting one rule among the filtered candidate alias rules based on a user's knowledge of the semiconductor manufacturing process.

In a further embodiment, the ranking includes:
computing each distance from each candidate alias rule to the original rule;
ordering the candidate alias rules in an ascending or descending order of the computed distances; and
removing one or more of the candidate alias rules if the one or more of the candidate alias rules does not satisfy at least one threshold.

In a further embodiment, the computing includes:
calculating a full-alias value of each candidate alias rule, the full-alias value representing a measured degree of a similarity between a candidate alias rule and the original rule;
calculating a used-alias value of each candidate alias rule, the used-alias value representing a measured dependency or correlation between a first tool step included in the original rule and a second tool step included in a candidate alias rule; and
calculating a target-alias value of each candidate alias rule, the target-alias value representing a measure of a relative difference between a first target mean associated with the original rule and a second target mean associated with a first candidate alias rule, the first target mean including first measurements associated with the original rule, the second target mean including second measurements associated with first candidate alias rule, the first candidate alias rule being one or more of the candidate alias rules, the first measurements including one or more of speed, power consumption and yield rate of semiconductor products manufactured according to the original rule, the second measurements including one or more of speed, power consumption and yield rate of semiconductor products manufactured according to the first candidate alias rule.

In a further embodiment, the distance is computed by calculating (1−the full-alias)+(1−the used-alias)+the target-alias.

In another embodiment, the distance is computed by calculating w1×(1−the full-alias value)+w2×(1−the used-alias value)+w3×the target-alias value, wherein the w1 is a weight value associated with the full-alias, the w2 is a weight value associated with the used-alias, and the w3 is a weight associated with the target-alias.

In a further embodiment, the knowledge comprises one or more of: a precision, recall, accuracy or variance of the candidate alias rules, a similarity between each candidate alias rule and to the original rule, similar target measures between each candidate alias rule and the original rule.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

FIG. 4 illustrates a table including an exemplary full-alias, used-alias, wafer count and target mean of each rule according to one embodiment of the present invention.

DETAILED DESCRIPTION

Table 1 illustrates an exemplary binary decision rule (i.e., a rule constructed based on IF-THEN-ELSE format) implemented by an empirical method by a user (e.g., engineer) to identify the root cause of the poor results.

TABLE 1

Exemplary binary decision rule

IF (Step1_Tool1 is true) AND (Step2_Tool2 is false)
THEN average speed measurement for 64 wafers is 124.66
ELSE average speed measurements for 228 wafers is 179.741.

The exemplary binary decision rule shown in Table 1 describes if Step1_Tool1 (i.e., a manufacturing 1 in a manufacturing tool 1) is used for 64 wafers and Step2_Tool2 is not used for those 64 wafers, an average measured clock speed of those 64 wafers is 124.66 (MHz). Otherwise, 228 wafers which were not processed by Step1_Tool1 or which were processed by Step 2_Tool2 have an average 179.741 (MHz) clock speed measurement. Baseman et al., "System and Method for Rule-Based Data Mining and Problem Detection for Semiconductor Fabrication", U.S. Pat. No. 7,539,585 B2, wholly incorporated by reference as if set forth herein, hereinafter "Baseman", describes generating a binary decision rule based on sampled data from a semiconductor manufacturing process or measurements (e.g., clock speed, power dissipation, yield rates, etc.) on semiconductor products (e.g., semiconductor chips, wafers, lots) manufactured in the semiconductor manufacturing process. Sampled data refers to data obtained from sensors and/or controlling software attached to semiconductor manufacturing tools that feed monitoring and manufacturing performance data to a centralized computing system and/or database (e.g., IBM® DB2, etc.) for processing.

Figure 5:
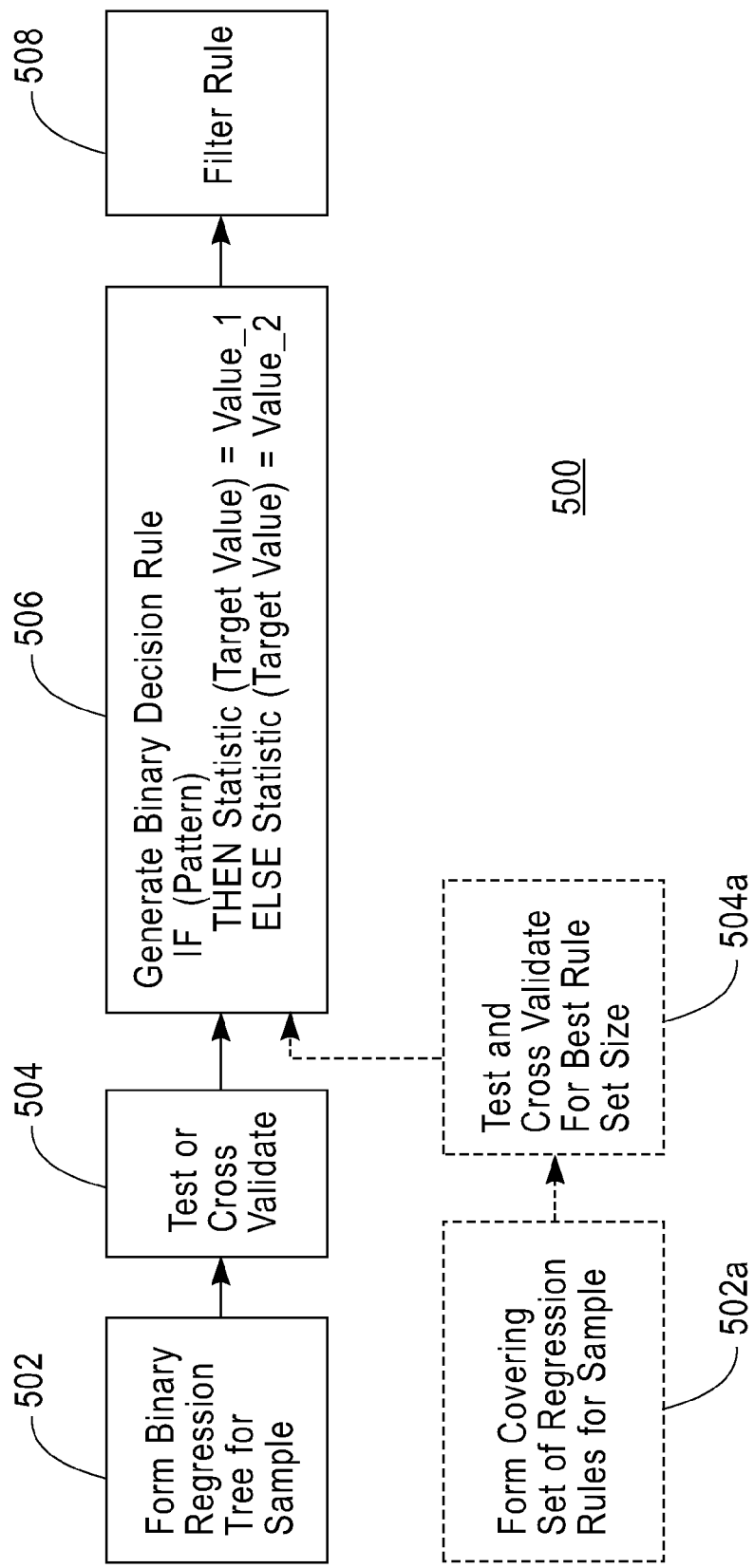
FIG. 5 illustrates an exemplary method for generating a binary decision rule according to one embodiment of the present invention.

According to one embodiment of the present invention, a computing system (e.g., a computing system 600) generates the binary decision rule, e.g., by running method steps illustrated in FIG. 5. FIG. 5 depicts an exemplary way of generating the binary decision rule according to one embodiment of the present invention. At step 502, the computing system grows a binary regression tree to a preliminary depth. The preliminary depth may be R, R being the total number of tool steps in a semiconductor manufacturing process. As known in the general art of binary regression trees, the preliminary depth may be a smaller number such as, for example, ten. The binary regression tree refers to a binary tree built through a recursive partitioning or splitting. Step 502 may be in accordance with conventional methods of forming a binary regression tree, as known in the data mining arts. Then step 504 tests or cross-validates to obtain a best size tree. Step 504 may, for example, test cross-validate according to known binary regression tree formation methods. At the completion of step 504 each path to a terminal node of the resulting binary regression tree is a potential rule. Next, step 506 generates an IF-THEN-ELSE type binary decision rule such as, for example, Table 1, based on the binary regression tree resulting from step 504. Step 506 is invoked because the binary regression tree resulting from step 504 typically includes rules based on lengthy conjunctions of tool step pairs, including many pairs having little, if any, actual significance with respect to a target, e.g. wafer yield.

One example for performing step 506 is according to a general outline as follows:

i) Determine whether a shorter rule is competitive with a complete path to a terminal node of the regression tree;
ii) Consider a maximum rule length j, i.e., the maximum number of tool step pairs in a conjunction rule in which an example value of j equals two;
iii) Examine each node in the binary regression tree, both terminal or nonterminal;
iv) If a result using just that node (tool step) is close to (or better) than a full path to that node, then that node replaces the full path.
v) If (iv) fails then, if the result using that node and one of its parents is close to (or better) than the full path to that node, the conjunction rule replaces the full path.

Next, step 508 filters the IF-THEN-ELSE rules generated by step 506. The filter rules performed by step 508 preferably include the following:

(1) Rule covers, i.e. split, a group having at least a given quantity wafers (QW), where the number QW exceeds a given minimum;
(2) Rule covers a given minimum of wafer lots, i.e., the quantity of wafers must both exceed the given minimum QW and must include wafers processed by at least the given minimum number of wafer lots; and/or
(3) Rule splits an overall group of wafers into an in-pattern group and out-of-pattern group such that a given statistic, e.g., average, median or variance, of a value of a given target (e.g., yield, clock speed) for wafers in the in-pattern group must differ from that statistic of the overall group by a given minimum distance.

The tool step(s) within the IF-THEN-ELSE rule generated by filtering step 508 provides statistically useful information to better perform investigative and, if necessary, remedial or other action relating to the particular tool(s) 16 and step(s) associated with that tool step(s).

Referring to FIG. 5, the generation of the IF-THEN-ELSE binary decision rule of for example, Table 1, may be performed by an embodiment using rule induction or data mining, as shown by steps 502a and 504a replacing 502 and 504, respectively. Step 502a of the depicted example rule induction forms a covering set of regression rules based on a history of the semiconductor manufacturing process, and step 504A tests and cross-validates to obtain a rule set having the best rule set size. Step 506 then generates the IF-THEN-ELSE binary decision rule as described above.

According to one embodiment, a user utilizes a binary decision rule to determine a root cause of a poor result in the semiconductor manufacturing process. For example, the original rule found based on Baseman methodology is considered the root cause of the poor result. The original rule may be empirically correct and accurate in accordance with a predictive validation. The predictive validation is a methodology in which a score of a test predicts scores on some criterion measurements. For example, an SAT score of a student may be used to predict the student's performance in a college.

However, the original rule may not be always the root cause. Then, users (e.g., engineers) need to find alternative rules to find the root cause. The users may find the alternative rules based on their experiences or knowledge of the semiconductor manufacturing process, similar empirical results of other manufacturing tools, multiple faulty tools conducting tool step(s) included in the original rule, etc.

Figure 3:
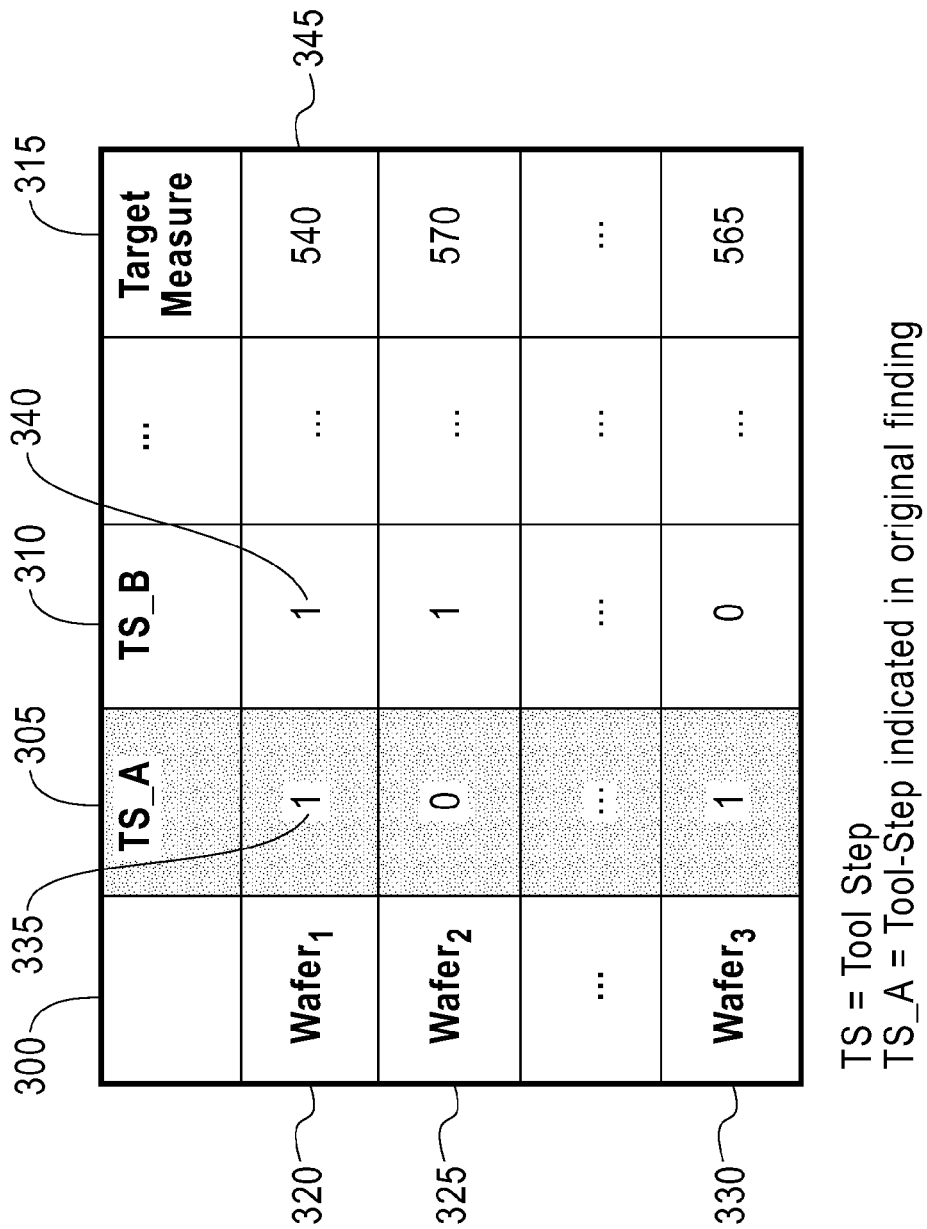
FIG. 3 illustrates an exemplary original rule and alias rule(s) according to one embodiment of the present invention.

According to one embodiment, a computing system (e.g., a computing system 500 in FIG. 5) determines a similarity of alias rules with respect to the original rule. For example, the computing system measures the similarity, e.g., by calculating a full-alias (full-alias is described in detail below) or used-alias (used-alias described in detail below), between binary populations representing, for example, history of manufacturing processes (e.g., TS_A (305) and/or TS_B (310) columns in FIG. 3 represented by 0 and 1). The full-alias and used alias are described in detail below. TS_A (305) in FIG. 3 refers to a particular step performed in a tool "A", where "A" is a variable name. A tool step includes, but is not limited to: cooling a wafer at 100 degrees for minutes in a specific tool. Users determine reasonable alias rules (i.e., potential faulty tool steps related to the original rule) among all alias rules based on information or knowledge. The information or knowledge includes, but not limited to: precision, recall, accuracy or variance of alias rules measured by true/false errors (e.g., used-alias=1 or full-alias=1 indicates no error), how well each alias rule matches to the original rule (i.e., a perfect match is a viable reasonable alias rule), similarity between each alias rule and the original rule, e.g., measured by full-alias or used-alias, similar target measures (e.g., similar yield rates) between each alias rule and the original rule.

Figure 1:
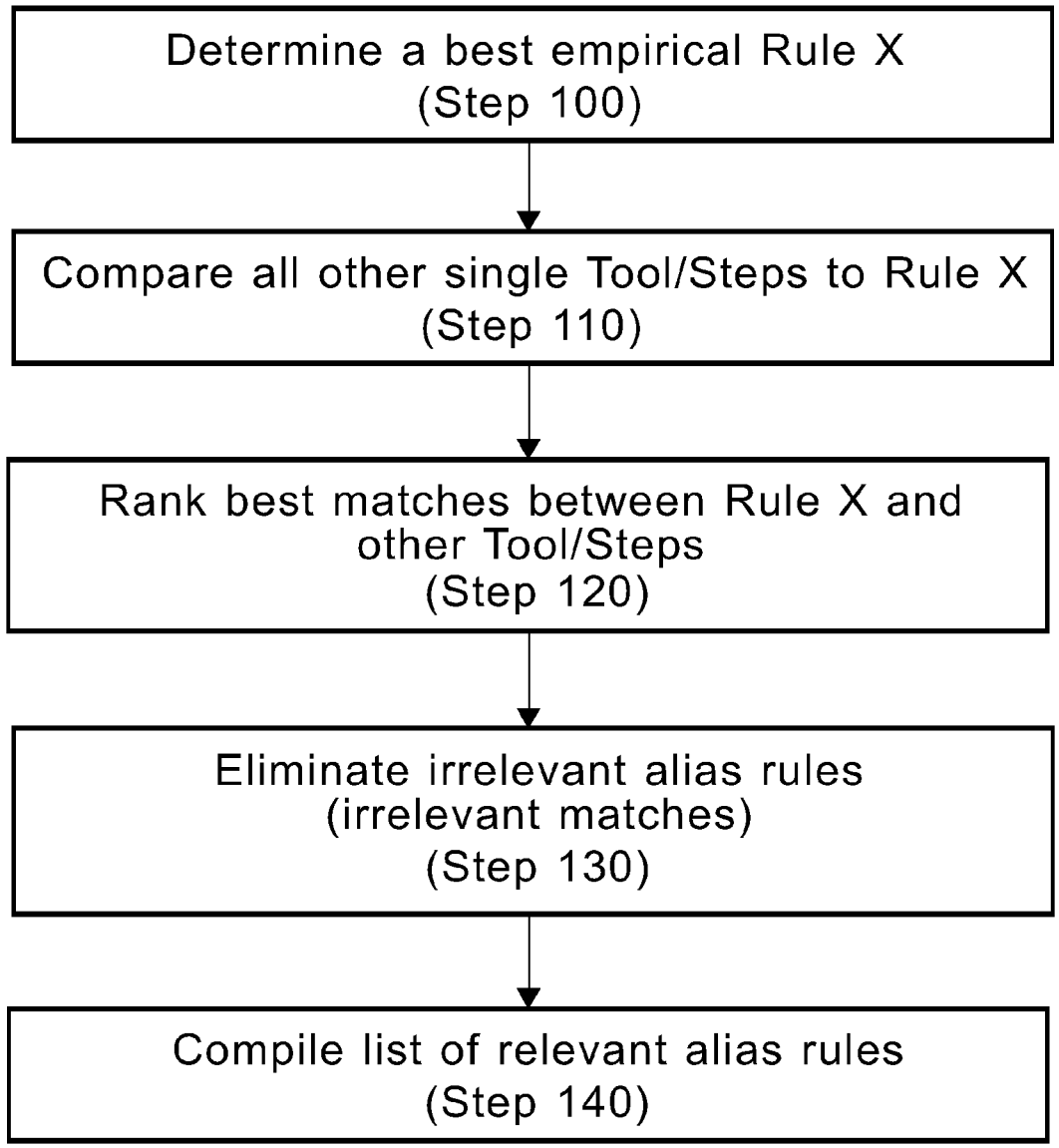
FIG. 1 illustrates a flow chart including method steps for determining a best alias rule in a semiconductor manufacturing process according to one embodiment of the present invention.
Figure 2:
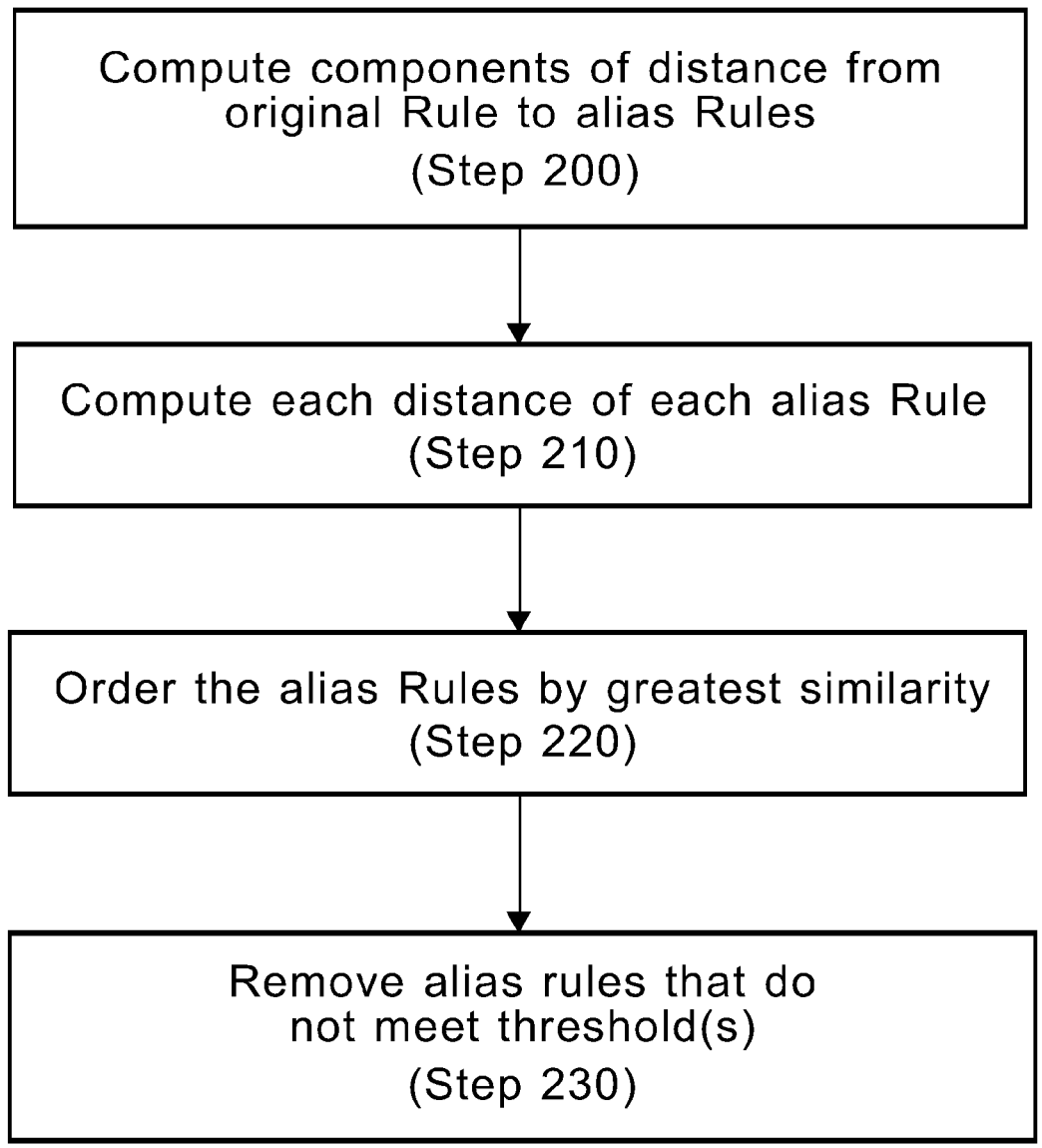
FIG. 2 illustrates a flow chart detailing the ranking step according to one embodiment of the present invention.

According to one embodiment, the computing system determines a "best" alias rule (i.e. the most likely faulty tool step related to the original rule) in a semiconductor manufacturing process, e.g., by performing method steps in FIGS. 1-2. FIG. 1 illustrates a flow chart including method steps for determining the best alias rule in the semiconductor manufacturing process. At step 100, the computing system obtains the original rule and candidate alias rules based on sampled data from the semiconductor manufacturing process or measurements from semiconductor products manufactured by the semiconductor manufacturing process. As described above, FIG. 5 illustrates how the computing system obtains the original rule and candidate alias rules. The candidate alias rules refer to tool steps related to the original rule.

At step 110, the computing system compares the original rule to each of the candidate alias rules, e.g., by matching a target measure between the original rule and a candidate alias rule. The calculating a target measure is described in detail below. For example, if the original rule is TS_A (305) in FIG. 3, then TS_B (310) in FIG. 3 is a candidate alias rule. The computing system compares calculated target measures 410 (e.g., a target "mean" value indicated in a target "mean" column 410 in FIG. 4) of TS_A (430 in FIG. 4) and TS_B (440 in FIG. 4). For example, as illustrated in FIG. 4, a target measure of TS_A (430) is 214.996 representing average wafer clock speed in MHz, for example. A target measure of TS_B (440) is 199.744. A target measure of TS_L (another candidate alias rule) (435) is 207.403. Then, the computing system determines that TS_L (435) has better match to the original rule than TS_B (440) does because the target measure of TS_L (435) is closer to the target measure of TS_A (430) than the target measure of TS_B (440) is. Thus, TS_L (435) is more likely to be the root cause of the poor results than TS_B (440) is.

At step 120, the computing system ranks the candidate rules according to the comparison or similarity (e.g., full-alias, used-alias, etc.). For example, based on FIG. 4, the computing system ranks TS_L (435) at the highest rank because TS_L (435) has the closest target measure to the target measure of TS_A (430) which is the original rule in this example. In another example, the computing system ranks TS_B (440), TS_C (445) and TS_D (450) at the highest ranks because TS_B (440), TS_C (445) and TS_D (450) have the highest similarity with TS_A (their used-alias scores are 1). In a further embodiment, the computing system calculates the ranking, e.g., by performing method steps described in detail herein below with respect to FIG. 2.

At step 130, the computing system filters the ranked candidate rules to eliminate irrelevant alias rules. For example, in FIG. 4, the computing system may eliminate TS_S (455) because its target measure is the most distant from the target measure of TS_A (430). The computing system may eliminate TS_X (460) because its full-alias is lowest (i.e., the most dissimilar to full-alias of TS_A). At step 140, the computing system compiles the list of relevant alias rules (i.e., remained alias rules after the filtering). A user (e.g., an engineer) selects an alias rule among the relevant alias rules based on the information or knowledge described above. The selected rule becomes the best alias rule. For example, a user may select TS_E (470) as the best alias rule because most of wafers of TS_A (430) are covered (used-alias=0.90), a similarity to TS_A (430) is relatively good (full-alias=0.76) and a variance from the target measure of TS_A (430) is relatively good (target mean=203) in comparison to other alternatives. In addition, the user may use physical knowledge of tool steps that can affect a semiconductor manufacturing process in a similar way as TS_A (430).

In a further embodiment, the original rule and/or the candidate alias rules includes at least one binary decision rule (e.g., a rule presented in Table 1) including an IF statement, an ELSE statement and a THEN statement as illustrated in Table 1. The IF statement includes conditional statements to evaluate whether conditions in the IF statement are true or false. The IF statement in the original rule and/or the candidate alias rules includes a single conditional clause. For example, the IF statement states "IF TS_B is true" to have only one single conditional clause, "TS_B is true." Alternatively, the IF statement can include multiple conditional clauses as described in Table 1. The exemplary IF statement described in the Table 1 includes two conditional statements, "Step1_Tool1 is true" and "Step2_Tool2 is false." The IF statement in the original rule and/or the candidate alias rules can include a plurality of conditional clauses.

In a further embodiment, the candidate alias rules include tool steps not included in the original rule. For example, in FIG. 4, if the original rule includes TS_A (430), the candidate alias rules do not include TS_A (430). The candidate alias rules may be TS_B (440), TS_C (445), TS_D (450), . . . , TS_Z (465), etc.

In a further embodiment, the step 120 for ranking of the candidate rules by the computing system as shown in FIG. 1 further includes method steps illustrated in FIG. 2. FIG. 2 particularly illustrates a flow chart detailing the ranking step according to one embodiment of the present invention. To rank the candidate alias rules, at step 200, the computing system computes components of a distance from the original rule to each candidate alias rule. The distance refers to a degree of similarity between the original rule and a candidate alias rule (B). A first component of the distance (d1) is calculated by subtracting full-alias of the candidate alias rule (B) from 1, e.g., d1=a−FA(B), where FA(B) refers to the full-alias of the candidate alias rule (B). The full-alias measures a degree of a substantial similarity between the original rule and the candidate alias rule (B). The full-alias is calculated by FA(B)=(count of (the original rule==B))/(count of (All wafers)), where "the original rule==B" refers that when the original rule is 1 (i.e., when tool step(s) included in the original rule is used), the candidate alias rule (B) is 1 (i.e., tool step(s) included in B is also used) and when the original rule is 0 (i.e., when tool step(s) included in the original rule is not used), the candidate alias rule (B) is 0 (i.e., tool step(s) included B is not used either). In other words, in FIG. 3, if TS_A (305) is assumed to be the original rule and TS_B (310) is the candidate alias rule (B), FA(B) is calculated by {(the number of rows in the table 300 which have identical values between TS_A (305) column and TS_B (310) column)/the number of wafers (N)}. The substantial similarity indicates how often two different tool steps operate in a same manner across all the wafers examined.

A second component of the distance (d2) is calculated by subtracting used-alias of the candidate alias rule (B) from 1, e.g., d2=1−UA(B), where UA(B) refers to the used-alias of the candidate alias rule (B). The used-alias measures a dependency or correlation between a first tool step included in the original rule and a second tool step included in the candidate alias rule (B). The used-alias includes a measurement of how many wafers that went through the first tool steps also went through the second tool step. The used-alias is calculated by UA(B)=(count of (the original rule==B==1))/(count of (the original rule==1)), where "the original rule==B==1" means when the original rule is 1 and the candidate alias rule (B) is 1. In other words, UA(B) is calculated by {(the number of wafers that went through the first tool step and the second tool step)/(the number of wafers that went through the first step)}. In other words, in FIG. 3, for example, if TS_A is assumed to be the original rule and TS_B is the candidate alias rule (B), UA(B) is calculated by {(the number of rows which have true ("1") value in TS_A (305) column and TS_B (310) column)/ (the number of rows which have true values in TS_A (305) column)}.

A third component of the distance (d3) is a target-alias (TA), i.e., d3=TA (B). TA(B), a target alias of B, is calculated by {|Target Measure of B−Target Measure of the original rule|/Target Measure of the original rule}. The target-alias measures a relative difference between a first target mean (first target measure) associated with the original rule and a second target mean (second target measure) associated with the candidate alias rule (B). For example, the first target measure includes measurements associated with the original rule including, but not limited to: clock speed, power consumption and yield rates of semiconductor products manufactured according to the original rule. The second target measure measurements associated with the candidate alias rule (B) including, but not limited to: clock speed, power consumption and yield rates of semiconductor products manufactured according to the candidate alias rule (B). A semiconductor product includes, but not limited to: a semiconductor chip (e.g., IBM® PowerPC®), a semiconductor wafer and a semiconductor lot. The semiconductor wafer includes a plurality of the semiconductor chips. The semiconductor lot refers to a set of the wafers.

Returning to FIG. 2, at step 210, the computing system computes the distance, e.g., by adding the first component, the second component and the third component. For example, the distance between the original rule and the candidate alias rule (B)=d1+d2+d3. At step 220, the computing system orders the candidate alias rules in an ascending or descending order of the computed distances. In other words, the computing system places at the first a candidate alias rule having the greatest similarity to the original rule (i.e., the smallest distance to the original rule). At step 230, the computing system removes one or more of the candidate alias rules if that one or more of the candidate alias rules does not satisfy at least one threshold. In other words, the computing system removes candidate alias rules such that d1>t1 or d2>t2 or d3>t3, where t1, t2 and t3 are thresholds assigned by users as a specific maximum distance is allowed. Based on the knowledge and past experience, the user may have indications (i.e., thresholds) of how similar results must be for a worthwhile investigation. Therefore, the computing system considers only candidate alias rules that show higher similarity (i.e., shorter distance) than the threshold(s).

In an alternative embodiment, the computing system computes the distance by calculating w1×(1−the full-alias)+w2× (1−the used-alias)+w3×the target-alias, wherein the w1 is a weight associated with the full-alias, the w2 is a weight associated with the used-alias, and the w3 is a weight associated with the target-alias. Without considering the knowledge, all weights are assigned equally. However, based on the knowledge and/or experience of the user, the user may want to emphasize one measure more than others. For example, the user may emphasize matches in target means and used-alias, but may not emphasize full-alias. Then, the user may assign a lower weight for full-alias and increase weight for the others (e.g., target means and user-alias).

In a further embodiment, the step 130 in FIG. 1 further includes one or more of: removing a first candidate alias rule if the direction of the target mean of the first candidate alias rule is opposite to the direction of the target mean of the original rule; removing a second candidate alias rule if the second candidate alias rule does not meet at least one operational criterion (e.g., a specific minimum number of wafers, a specific minimum number of lots, a specific minimum deviation of target from sample mean) of a semiconductor manufacturing process; removing a third candidate alias rule if the third candidate alias rule does not meet a pre-determined value set by a statistical significant test such as a T test (i.e., a statistical test for assessing whether the means of two groups are statistically different each other); removing a fourth candidate alias rule if full-alias of the fourth candidate alias rule is less than a threshold (e.g., 0.5); removing a fifth candidate alias rule if used-alias of the fifth candidate alias rule is less than a threshold (e.g., 0.5). The first candidate alias rule, the second candidate alias rule, the third candidate alias rule, the fourth alias rule and the fifth candidate alias rule are one or more of the candidate alias rules. The target measure may be a measure of semiconductor chip speed. The user may look for slow semiconductor chips (i.e., chips whose speed slower than its specification), not fast semiconductor chips (i.e., chips whose speed faster than its specification). For example, two test measures may deviate in equal magnitude from an overall mean (average). However, one test measure may be fast and the other slow. Thus, the computing system provides a filter that selects a deviation in the same direction, either fast or slow. A comparator (i.e., a logic comparing semiconductor chip speed to speed described in its specification) may be used for the filter. National Institute of Standards and Technology (NIST), "T Test", DATAPLOT Reference Manual, Mar. 12, 1997, http://www.itl.nist.gov/div898/software/dataplot/refman1/ch3/t_test.pdf, wholly incorporated by reference as if set forth herein, describes T Test in detail.

FIG. 3 illustrates an exemplary alias rule according to one embodiment. Table 300 includes, but not limited to: TS_A (305), TS_B (310), target measure (315) of each wafer. TS_A (305) and TS_B (310) are tool steps used in a semiconductor manufacturing process. The table 300 may include a plurality of other tool steps. In this example, TS_A (305) is the original rule. TS_B (310) is a candidate alias rule. Table 300 illustrates how each wafer is processed or manufactured. For example, Wafer$_1$ (320) went through processing steps TS_A and TS_B (in Tools A and B, respectively), i.e., TS_A=1 (335) and TS_B=1 (340). The target measure (315) of Wafer$_1$ (320) is shown in Table 300 as having a value 540 (345). Table 300 may include a plurality of Wafers (e.g., Wafer$_1$ (320), Wafer$_2$ (325), Wafer$_N$ (330), etc.) and their corresponding processing steps and target measures.

FIG. 4 illustrates exemplary similarity measurements of exemplary candidate alias rules according to one embodiment of the present invention. Table 400 includes diverse similarity measurements including, but not limited to: target mean (target measure) 410, used-alias (420) and full-alias (425). Table 400 may further include wafer count (the number of wafers) 415, target-alias (not shown) and tool steps (original rule and candidate alias rules) (405). In the example depicted in FIG. 4, TS_A (430) is the original rule. TS_B (440), TS_C (445), TS_D (450), . . . , TS_L (435), . . . , TS_S (455), TS_X (460), . . . , TS_Z (465) are candidate alias rules. Table 400 illustrates the target measure (410), wafer count (the number of wafers that went through a tool step) (415), used-alias (420) and full-alias (425) of each candidate alias rule.

Figure 6:
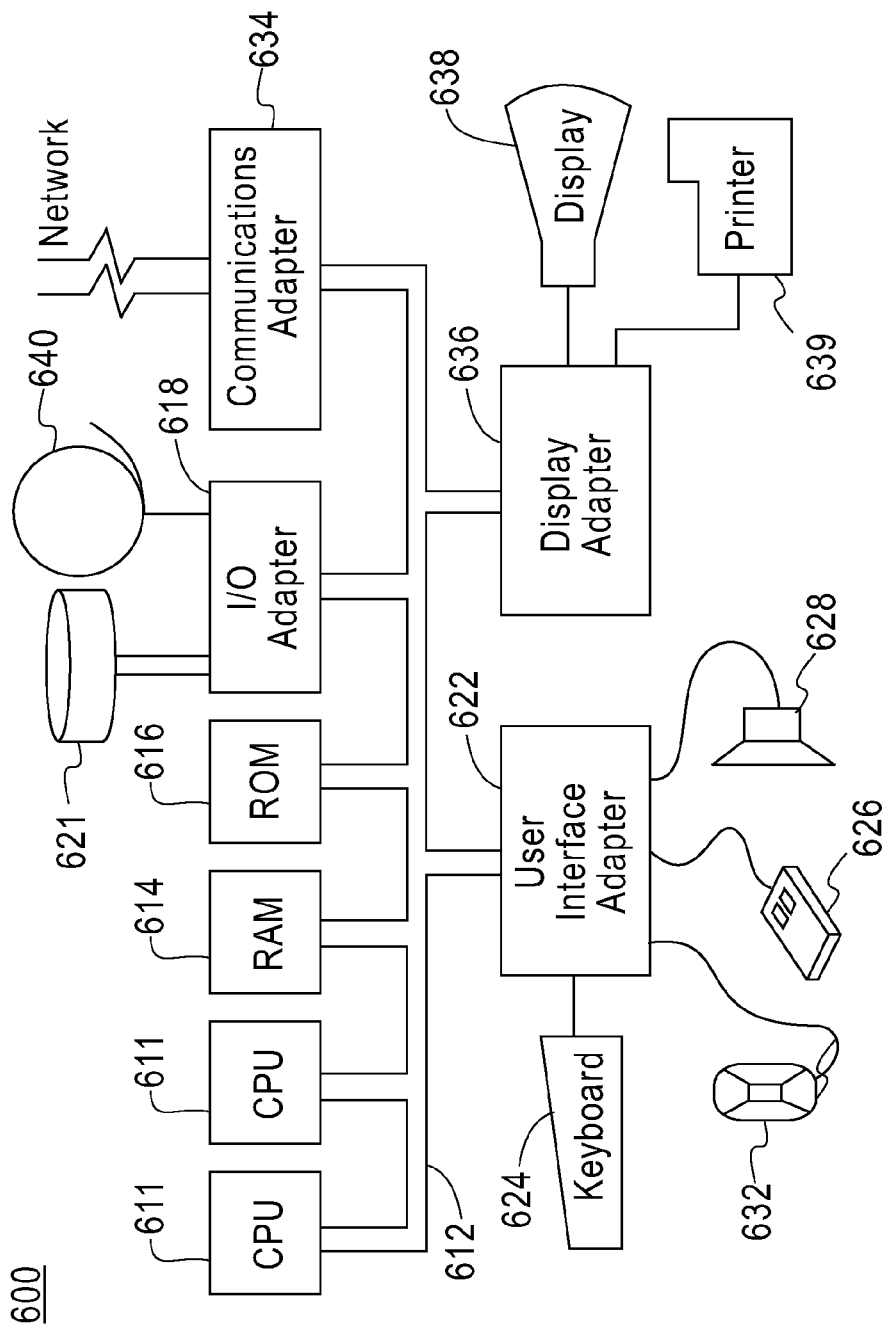
FIG. 6 illustrates an exemplary hardware configuration for implementing the flow charts depicted in FIGS. 1-2 and 5 according to one embodiment of the present invention.

FIG. 6 illustrates an exemplary hardware configuration of a computing system 600 running and/or implementing the method steps in FIGS. 1-2 and 5. The hardware configuration preferably has at least one processor or central processing unit (CPU) 611. The CPUs 611 are interconnected via a system bus 612 to a random access memory (RAM) 614, read-only memory (ROM) 616, input/output (I/O) adapter 618 (for connecting peripheral devices such as disk units 621 and tape drives 640 to the bus 612), user interface adapter 622 (for connecting a keyboard 624, mouse 626, speaker 628, microphone 632, and/or other user interface device to the bus 612), a communication adapter 634 for connecting the system 600 to a data processing network, the Internet, an Intranet, a local area network (LAN), etc., and a display adapter 636 for connecting the bus 612 to a display device 638 and/or printer 639 (e.g., a digital printer of the like).

Although the embodiments of the present invention have been described in detail, it should be understood that various changes and substitutions can be made therein without departing from spirit and scope of the inventions as defined by the appended claims. Variations described for the present invention can be realized in any combination desirable for each particular application. Thus particular limitations, and/or embodiment enhancements described herein, which may have particular advantages to a particular application need not be used for all applications. Also, not all limitations need be implemented in methods, systems and/or apparatus including one or more concepts of the present invention.

The present invention can be realized in hardware, software, or a combination of hardware and software. A typical combination of hardware and software could be a general purpose computer system with a computer program that, when being loaded and run, controls the computer system such that it carries out the methods described herein. The present invention can also be embedded in a computer program product, which comprises all the features enabling the implementation of the methods described herein, and which—when loaded in a computer system—is able to carry out these methods.

Computer program means or computer program in the present context include any expression, in any language, code or notation, of a set of instructions intended to cause a system having an information processing capability to perform a particular function either directly or after conversion to another language, code or notation, and/or reproduction in a different material form.

Thus the invention includes an article of manufacture which comprises a computer usable medium having computer readable program code means embodied therein for causing a function described above. The computer readable program code means in the article of manufacture comprises computer readable program code means for causing a computer to effect the steps of a method of this invention. Similarly, the present invention may be implemented as a computer program product comprising a computer usable medium having computer readable program code means embodied therein for causing a function described above. The computer readable program code means in the computer program product comprising computer readable program code means for causing a computer to affect one or more functions of this invention. Furthermore, the present invention may be implemented as a program storage device readable by machine, tangibly embodying a program of instructions executable by the machine to perform method steps for causing one or more functions of this invention.

The present invention may be implemented as a computer readable medium (e.g., a compact disc, a magnetic disk, a hard disk, an optical disk, solid state drive, digital versatile disc) embodying program computer instructions (e.g., C, C++, Java, Assembly languages, .Net, Binary code) run by a processor (e.g., Intel® Core™, IBM® PowerPC®) for causing a computer to perform method steps of this invention. The present invention may include a method of deploying a computer program product including a program of instructions in a computer readable medium for one or more functions of this invention, wherein, when the program of instructions is run by a processor, the compute program product performs the one or more of functions of this invention.

It is noted that the foregoing has outlined some of the more pertinent objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

What is claimed is:

1. A computer-implemented method for determining a best alias rule in a semiconductor manufacturing process, the method comprising:
obtaining an original rule and candidate alias rules;
comparing the original rule to the candidate alias rules;

ranking the candidate alias rules according to the comparison;
filtering the ranked candidate alias rules; and
selecting one rule among the filtered candidate alias rules based on a user's knowledge of the semiconductor manufacturing process,
wherein the ranking includes:
computing each distance from each candidate alias rule to the original rule;
ordering the candidate alias rules in an ascending or descending order of the computed distances;
comparing the computed distance of each candidate rule with at least one threshold;
removing one or more of the candidate alias rules if the computed distance of the one or more of the candidate alias rules does not satisfy the at least one threshold,
wherein the computing includes:
calculating a full-alias value of each candidate alias rule, the full-alias value representing a measured degree of a similarity between a candidate alias rule and the original rule;
calculating a used-alias value of each candidate alias rule, the used-alias value representing a measured dependency or correlation between a first tool step included in the original rule and a second tool step included in a candidate alias rule; and
calculating a target-alias value of each candidate alias rule, the target-alias value representing a measure of a relative difference between a first target mean associated with the original rule and a second target mean associated with a first candidate alias rule, the first target mean including first measurements associated with the original rule, the second target mean including second measurements associated with the first candidate alias rule, the first candidate alias rule being one or more of the candidate alias rules, the first measurements including one or more of speed, power consumption and yield rate of semiconductor products manufactured according to the original rule, the second measurements including one or more of speed, power consumption and yield rate of semiconductor products manufactured according to the first candidate alias rule.

2. The computer-implemented method according to claim 1, wherein the original rule includes a binary decision rule comprising an IF statement, an ELSE statement and a THEN statement.

3. The computer-implemented method according to claim 2, wherein the IF statement includes a single conditional clause or multiple conditional clauses.

4. The computer-implemented method according to claim 1, wherein the user's knowledge comprises one or more of: a precision, recall, accuracy or variance of the candidate alias rules, a similarity between each candidate alias rule and to the original rule, similar target measures between each candidate alias rule and the original rule.

5. The computer-implemented method according to claim 1, wherein said candidate alias rules include individual tool steps not included in the original rule.

6. The computer-implemented method according to claim 1, wherein the distance is computed by calculating (1−the full-alias value)+(1−the used-alias value)+the target-alias value.

7. The computer-implemented method according to claim 1, wherein the distance is computed by calculating $w1 \times (1-$ the full-alias value$)+w2 \times (1-$the used-alias value$) +w3 \times$ the target-alias value, wherein the $w1$ is a weight value associated with the full-alias, the $w2$ is a weight value associated with the used-alias, and the $w3$ is a weight associated with the target-alias.

8. The computer-implemented method according to claim 1, wherein the filtering includes one or more of:
removing the first candidate alias rule if a direction of the second target mean of the first candidate alias rule is opposite to a direction of the first target mean of the original rule;
removing a second candidate alias rule if the second candidate alias rule does not meet at least one operational criterion of the semiconductor manufacturing process;
removing a third candidate alias rule if the third candidate alias rule does not meet a pre-determined value set by a statistical significance test;
removing a fourth candidate alias rule if the full-alias of the fourth candidate alias rule is less than a threshold;
removing a fifth candidate alias rule if the used alias of the fifth candidate alias rule is less than a threshold;
wherein the first candidate alias rule, the second candidate alias rule, the third candidate alias rule, the fourth alias rule and the used-alias of the fifth candidate alias rule are one or more of the candidate alias rules.

9. The computer-implemented method according to claim 1, wherein the semiconductor products manufactured according to the original rule and the first candidate alias rule includes one or more of: at least one semiconductor chip, at least one semiconductor wafer and at least one semiconductor lot.

10. A computer-implemented system for determining a best alias rule in a semiconductor manufacturing process, the system comprising:
a memory device; and
a processor unit in communication with the memory device, the processor unit performs steps of:
obtaining an original rule and candidate alias rules;
comparing the original rule to the candidate alias rules;
ranking the candidate alias rules according to the comparison;
filtering the ranked candidate alias rules; and
selecting one rule among the filtered candidate alias rules based on a user's knowledge of the semiconductor manufacturing process,
wherein the ranking includes:
computing each distance from each candidate alias rule to the original rule;
ordering the candidate alias rules in an ascending or descending order of the computed distances; and
comparing the computed distance of each candidate rule with at least one threshold;
removing one or more of the candidate alias rules if the computed distance of the one or more of the candidate alias rules does not satisfy the at least one threshold,
wherein the computing includes:
calculating a full-alias value of each candidate alias rule, the full-alias value representing a measured degree of a similarity between a candidate alias rule and the original rule;
calculating a used-alias value of each candidate alias rule, the used-alias value representing a measured dependency or correlation between a first tool step included in the original rule and a second tool step included in a candidate alias rule; and
calculating a target-alias value of each candidate alias rule, the target-alias value representing a measure of a relative difference between a first target mean associated with the original rule and a second target mean associated with a first candidate alias rule, the first target mean including first measurements associated with the original rule, the second target mean including second measurements associated with the first candidate alias rule, the first candidate alias rule being one or more of the candidate alias rules, the first measurements including one or more of speed, power consumption and yield rate of semiconductor products manufactured according to the original rule, the second measurements including one or more of speed, power consumption and yield rate of semiconductor products manufactured according to the first candidate alias rule.

11. The computer-implemented system according to claim 10, wherein the original rule includes a binary decision rule comprising an IF statement, an ELSE statement and a THEN statement.

12. The computer-implemented system according to claim 11, wherein the IF statement includes a single conditional clause or multiple conditional clauses.

13. The computer-implemented system according to claim 10, wherein the user's knowledge comprises one or more of: a precision, recall, accuracy or variance of the candidate alias rules, a similarity between each candidate alias rule and to the original rule, similar target measures between each candidate alias rule and the original rule.

14. The computer-implemented system according to claim 10, wherein said candidate alias rules include individual tool steps not included in the original rule.

15. The computer-implemented system according to claim 10, wherein the distance is computed by calculating (1−the full-alias value) +(1−the used-alias value) +the target-alias value.

16. The computer-implemented system according to claim 10, wherein the distance is computed by calculating w1×(1−the full-alias value)+w2×(1−the used-alias value)+w3×the target-alias value, wherein the w1 is a weight value associated with the full-alias, the w2 is a weight value associated with the used-alias, and the w3 is a weight associated with the target-alias.

17. The computer-implemented system according to claim 10, wherein the filtering includes one or more of:
removing the first candidate alias rule if a direction of the second target mean of the first candidate alias rule is opposite to a direction of the first target mean of the original rule;
removing a second candidate alias rule if the second candidate alias rule does not meet at least one operational criterion of the semiconductor manufacturing process;
removing a third candidate alias rule if the third candidate alias rule does not meet a pre-determined value set by a statistical significance test;
removing a fourth candidate alias rule if the full-alias of the fourth candidate alias rule is less than a threshold;
removing a fifth candidate alias rule if the used-alias of the fifth candidate alias rule is less than a threshold;
wherein the first candidate alias rule, the second candidate alias rule, the third candidate alias rule, the fourth alias rule and the fifth candidate alias rule are one or more of the candidate alias rules.

18. The computer-implemented system according to claim 10, wherein the semiconductor products manufactured according to the original rule and the first candidate alias rule includes one or more of: at least one semiconductor chip, at least one semiconductor wafer and at least one semiconductor lot.

19. A computer program product comprising a computer readable medium, the computer readable medium excluding only a propagating signal, the computer readable medium embodying computer program instructions being run by a processor for causing a computer to perform method steps for determining a best alias rule in a semiconductor manufacturing process, said method steps comprising the steps of:
obtaining an original rule and candidate alias rules;
comparing the original rule to the candidate alias rules;
ranking the candidate alias rules according to the comparison;
filtering the ranked candidate alias rules; and
selecting one rule among the filtered candidate alias rules based on a user's knowledge of the semiconductor manufacturing process,
wherein the ranking includes:
computing each distance from each candidate alias rule to the original rule;
ordering the candidate alias rules in an ascending or descending order of the computed distances; and
comparing the computed distance of each candidate rule with at least one threshold;
removing one or more of the candidate alias rules if the computed distance of the one or more of the candidate alias rules does not satisfy the at least one threshold,
wherein the computing includes:
calculating a full-alias value of each candidate alias rule, the full-alias value representing a measured degree of a similarity between a candidate alias rule and the original rule;
calculating a used-alias value of each candidate alias rule, the used-alias value representing a measured dependency or correlation between a first tool step included in the original rule and a second tool step included in a candidate alias rule; and
calculating a target-alias value of each candidate alias rule, the target-alias value representing a measure of a relative difference between a first target mean associated with the original rule and a second target mean associated with a first candidate alias rule, the first target mean including first measurements associated with the original rule, the second target mean including second measurements associated with the first candidate alias rule, the first candidate alias rule being one or more of the candidate alias rules, the first measurements including one or more of speed, power consumption and yield rate of semiconductor products manufactured according to the original rule, the second measurements including one or more of speed, power consumption and yield rate of semiconductor products manufactured according to the first candidate alias rule.

* * * * *